(12) United States Patent
Ishida (10) Patent No.: US 6,194,955 B1
(45) Date of Patent: Feb. 27, 2001

(54) CURRENT SOURCE SWITCH CIRCUIT (75) Inventor: Hideki Ishida, Kanagawa (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/283,298

(22) Filed: Apr. 1, 1999

(30) Foreign Application Priority Data

Sep. 22, 1998 (JP) .................................................. 10-267763

(51) Int. Cl.⁷ ...................................................... G05F 1/10
(52) U.S. Cl. ............................................. 327/538; 327/543
(58) Field of Search .................................... 323/313, 314, 323/315; 327/108, 131, 132, 374, 530, 538, 543, 545, 546

(56) References Cited

U.S. PATENT DOCUMENTS 4,322,636 * 3/1982 Schroder .............................. 307/246
5,825,218 * 10/1998 Colli et al. ............................ 327/112

FOREIGN PATENT DOCUMENTS 5-48424   2/1993 (JP) .
7-135452  5/1995 (JP) .

* cited by examiner

*Primary Examiner*—Jeffrey Zweizig
(74) *Attorney, Agent, or Firm*—Arent Fox Kintner Plotkin & Kahn, PLLC (57) ABSTRACT

A current source switch circuit has at least one transistor forming part of a current source, and one switch for controlling the supply of an electric current from the transistor to a load. A voltage application unit applies a voltage having a value in an operation state as a current source to a transistor forming part of the current source while no electric current is provided from the switch to the load.

4 Claims, 10 Drawing Sheets

FIG. 1

PRIOR ART

CURRENT SOURCE SWITCH CIRCUIT

BACKGROUND OF THE INVENTION

1. Field of the Invention

The present invention relates to a large scale integrated circuit (LSI), and more specifically to a CMOS LSI current source switch circuit for switching on and off an electric current to be provided from the current source of the LSI to a load.

2. Description of the Related Art

Various circuits such as a voltage control oscillator (VCO), a loop filter used for a phase locked loop (PLL), a timer using a time constant of an RC, etc. can control the current source of an LSI.

Figure 1:
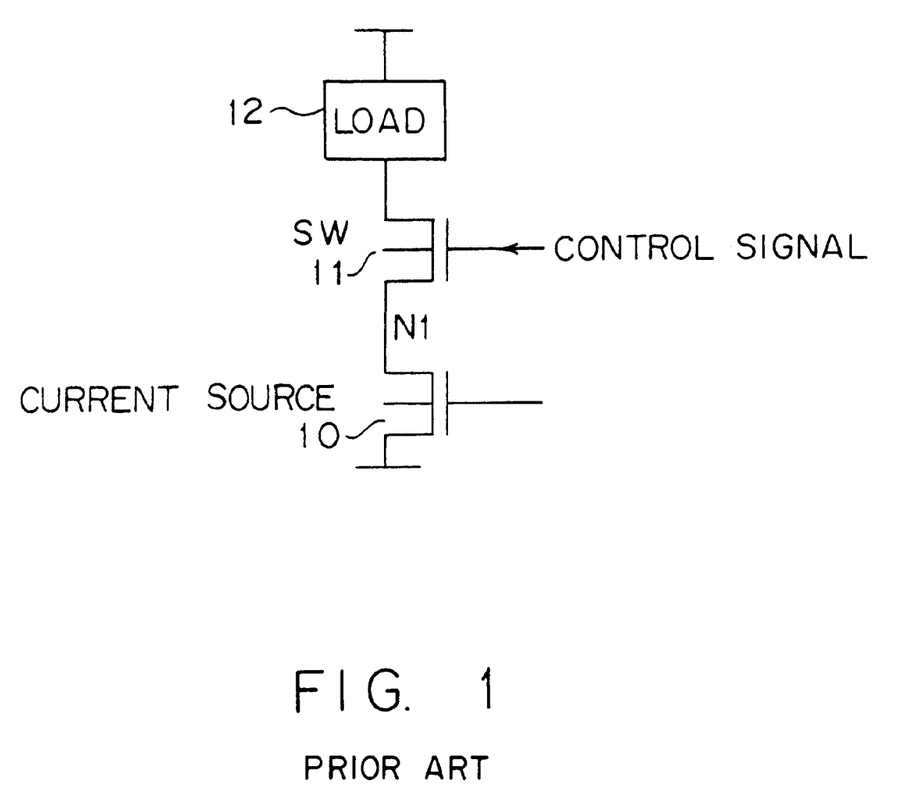
FIG. 1 shows the first conventional technology of the current source switch circuit.
Figure 2:
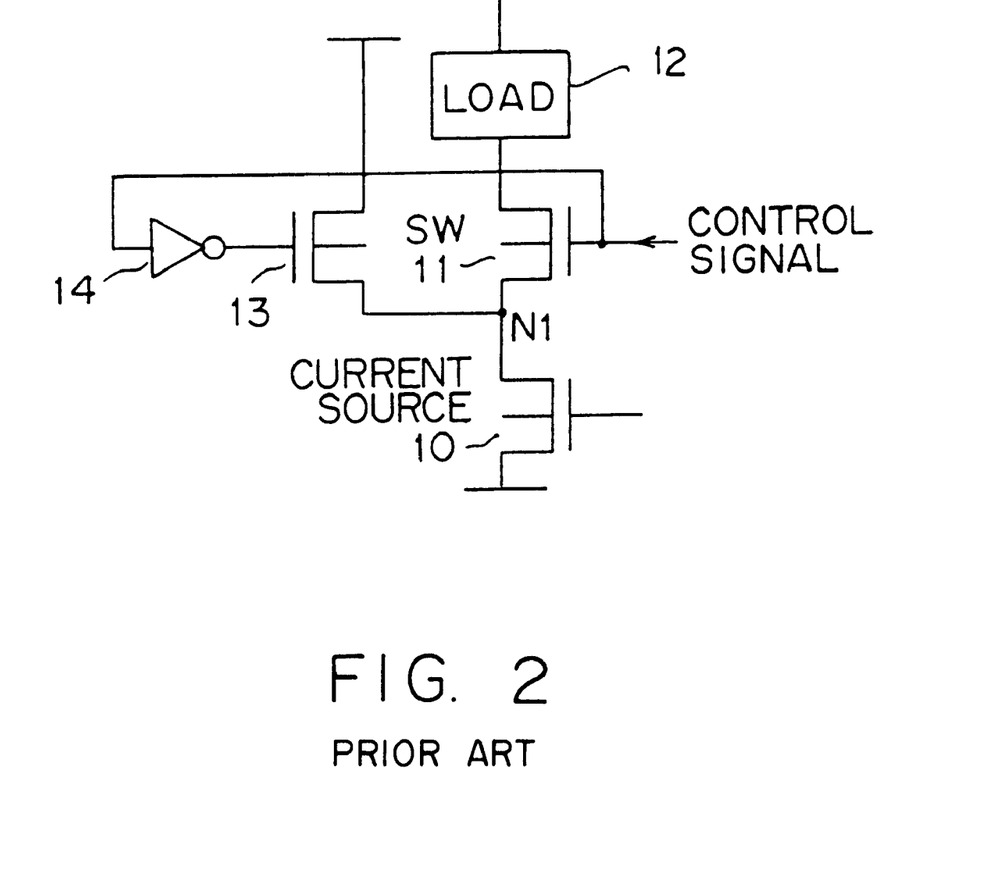
FIG. 2 shows the second conventional technology of the current source switch circuit.

FIGS. 1 and 2 show the conventional technology of a current source switch circuit for switching on and off the electric current flowing from a current source to a load.

In the circuit shown in FIG. 1, a FET 11 functions as a switch for turning on and off the electric current provided from a MOS FET (current source) 10 which is connected to, for example, the ground side, and forms part of a current source; and a load 12 connected to, for example, an power supply are serially connected. When it becomes unnecessary to provide an electric current for the load 12, the circuit shuts off the FET 11 according to a control signal input to the gate of the FET 11, and the current source 10 is disconnected from the load 12.

The circuit shown in FIG. 2 is often used in a high-speed digital/analog converter, etc. In the circuit shown in FIG. 2, a FET 13 is connected between a power supply and a node N1, that is, between the current source 10 and the switch 11. To the gate of the FET 13, an inverter 14 provided by inverting the control signal provided for the gate of the switch 11 is connected. In this circuit, when it is not necessary that an electric current flows through the load 12, the switch 11 is turned off according to the control signal, and the switch 13 is turned on. As a result, the electric current flowing through the current source 10 is returned to the power supply, that is, abandoned.

According to the first conventional technology shown in FIG. 1, the current source 10 is turned off by turning off the switch 11. Therefore, it takes some time to reach a necessary value of the node N1 to operate the current source 10. Furthermore, the amount of the shift of an electric charge is large in switching on/off compared to the junction capacity of the FET. As a result, there has been the problem that a quick switch cannot be realized.

To solve the above described problem, according to the second conventional technology, the current source 10 is not turned off, and the shift of the electric charge to the junction capacity is minimized to a successful quick switch. However, this technology has the problem that it requires more electric power to operate the current source 10 even when it is not necessary to provide an electric current for the load 12.

SUMMARY OF THE INVENTION

The present invention aims at providing a current source switch circuit for realizing a quick switch with smaller electric power.

The current source switch circuit according to the present invention requires at least a transistor forming part of a current source, and a switch for controlling the supply of an electric current from the transistor to a load. When an electric current is not provided by a switch for a load, the electric voltage having a value in an operating state as a current source is applied to the transistor (the supply of an electric current to the load is controlled by the switch).

By applying the voltage to the transistor, it becomes possible to keep the transistor operating in a saturation area. Thus, regardless of ON/OFF of the switch, the parasitic capacitance of the transistor is hardly charged or discharged. The rise time of the voltage when the switch is turned on can be very short. As a result, the electric current provided for the load becomes more stable, thereby realizing a quicker switch. Since a smaller amount of electric current flows through the entire circuit when no electric current flows through the load, less electric power is required.

DESCRIPTION OF THE PREFERRED EMBODIMENTS

Figure 3:
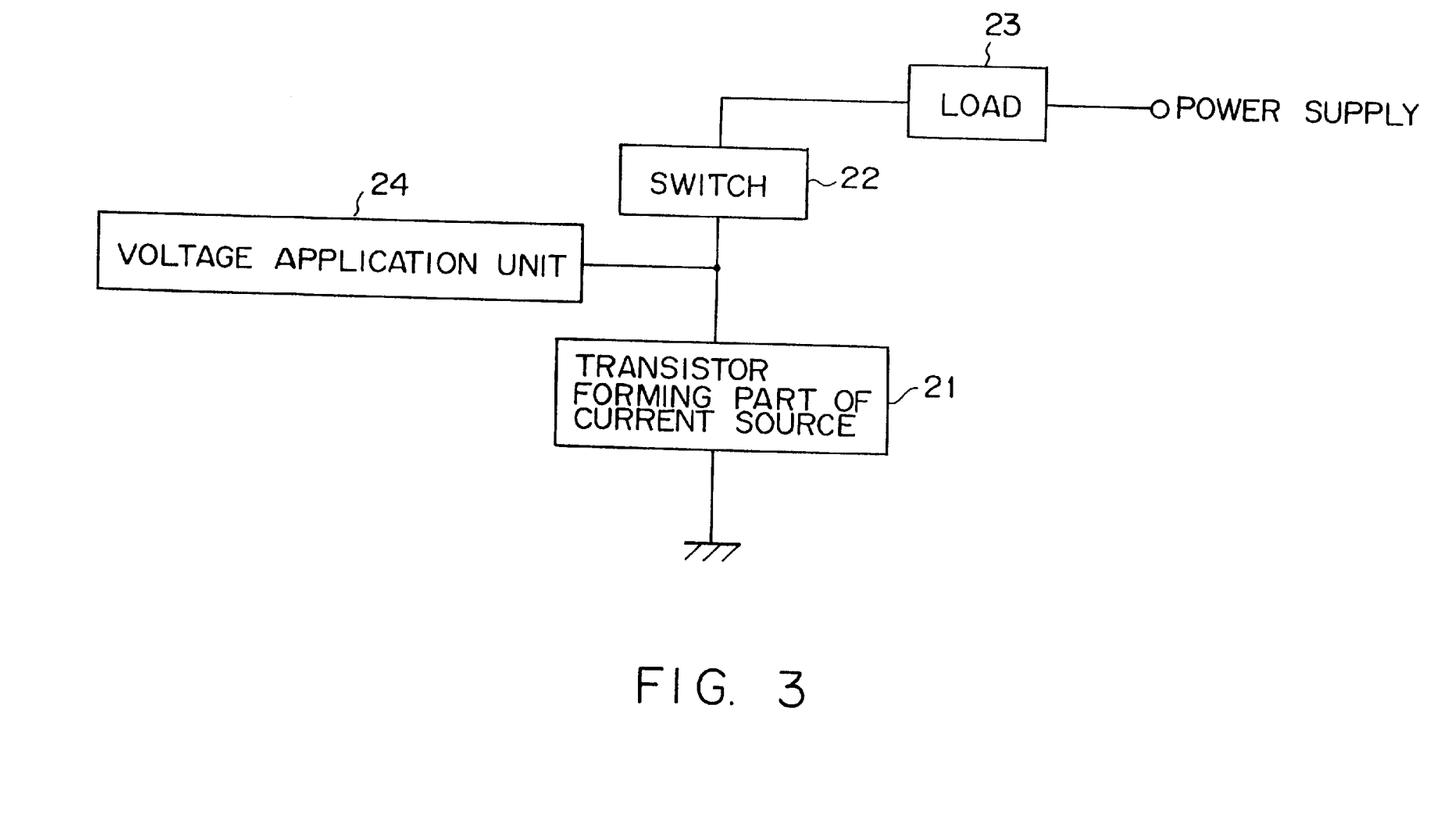
FIG. 3 shows the basic configuration of the current source switch circuit according to the present invention.

FIG. 3 shows the basic configuration of the current source switch circuit according to the present invention. Practically, FIG. 3 is a block diagram showing the basic configuration of the current source switch having a transistor 21 forming part of a current source and a switch 22 according to the present invention.

As shown in FIG. 3, a voltage application unit 24 is connected to the connection point between the transistor 21 forming part of a current source and the switch 22. The voltage application unit 24 applies a value of voltage in the operating state as the current source of the transistor 21 when it is not necessary that an electric current is provided for the load 23. Thus, when it is not necessary that an electric current is provided for the load 23, the transistor 21 keeps its operation in the saturation area.

The capacitance of the junction of the transistor largely depends on, for example, the voltage between a drain and a gate, but the value changes little in the saturation area. Therefore, the charge and discharge of the junction capacitance in the transistor 21 is small regardless of ON/OFF of the switch 22. As a result, a quicker switch can be realized, and a stable electric current can be provided for the load 23.

When the current source comprising the transistor 21 is, for example, the current source on the side of the mirror in a current mirror circuit, that is, on the side where an electric current is received, the voltage application unit 24 applies the voltage at the connection point between the original current source of the current mirror circuit and the transistor simulated as a diode in the current mirror circuit. The voltage depends on the terminal voltage to be applied to the load 23 at the next point where an electric current flows through the load 23.

Figure 4:
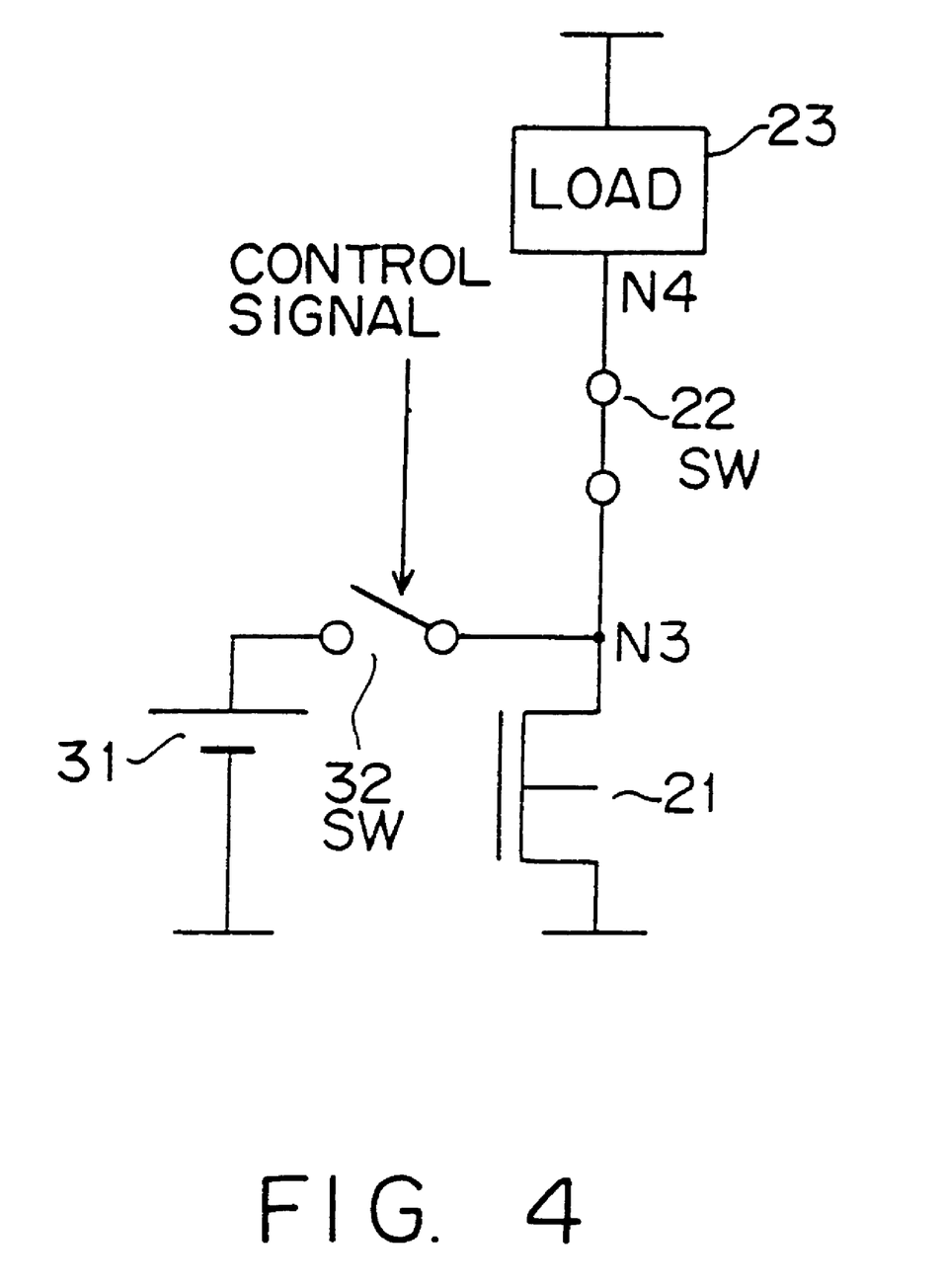
FIG. 4 shows a practical example of the basic configuration shown in FIG. 3.

FIG. 4 shows a practical example of the basic configuration shown in FIG. 3. In the configuration shown in FIG. 4, the unit also shown in FIG. 3 is assigned the same unit number.

As shown in FIG. 4, the transistor 21 comprising a current source is connected to the ground side. The switch 22 and the load 23 connected to, for example, a power supply, are serially connected to the transistor 21. A power supply 31 and a switch 32 are serially connected to a node N3 as a connection point between the transistor 21 and the switch 22. The power supply 31 and the switch 32 correspond to the voltage application unit 24 shown in FIG. 3.

The switch 22 is turned off when it is not necessary to provide an electric current for the load 23. Instead, the voltage of the power supply 31 is applied to the node N3 by turning on the switch 32. The value of the voltage is set such that the transistor 21 forming part of a current source functions as a current source, that is, the transistor 21 functions in the saturation area. As a result, a quicker switch can be realized, and a stable electric current can be obtained.

Figure 5:
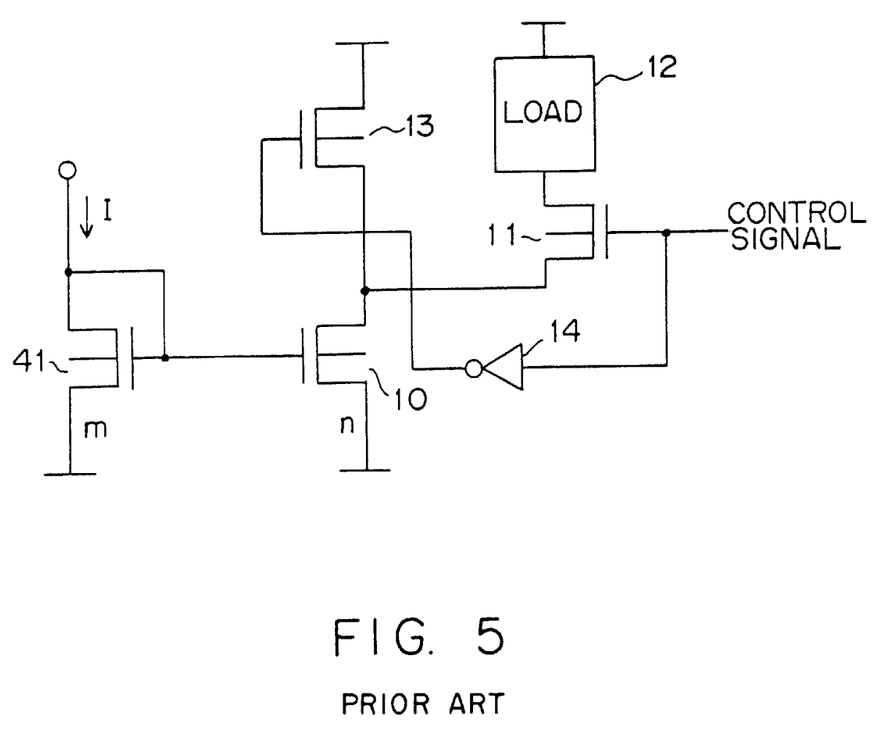
FIG. 5 shows an electric current flowing through the entire circuit according to the conventional technology.
Figure 6:
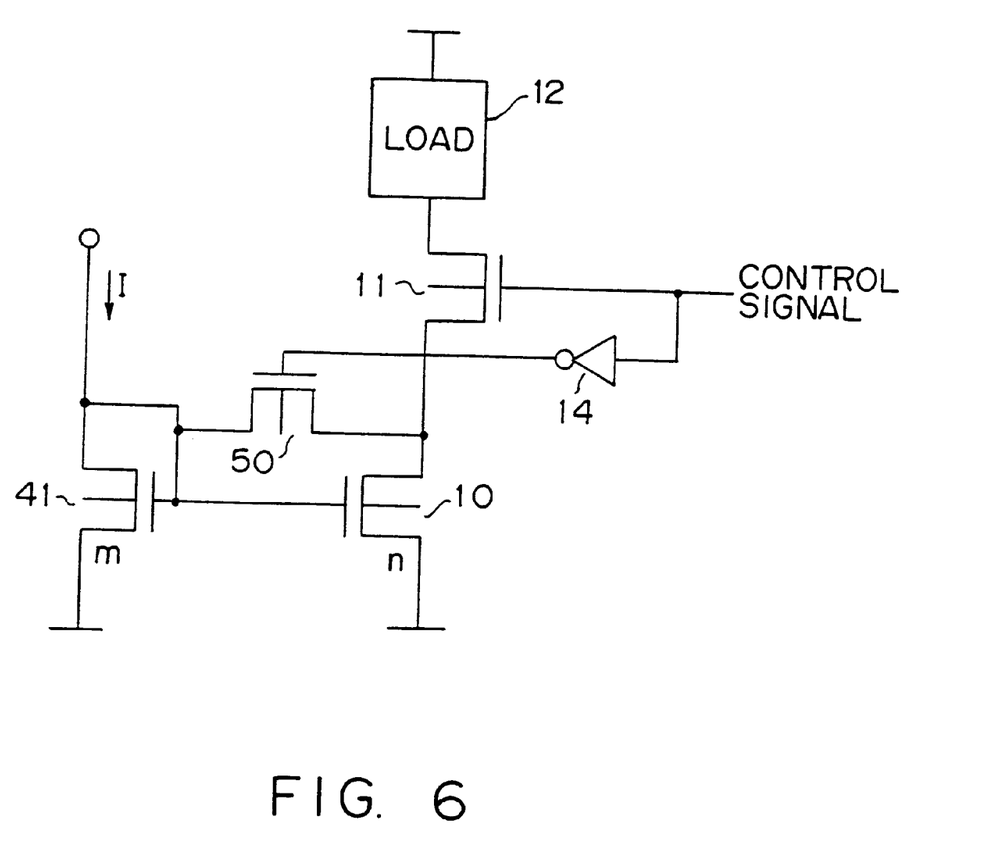
FIG. 6 shows an electric current flowing through the current source switch circuit according to the present invention.

FIGS. 5 and 6 show that the present invention can solve the problem with the second conventional technology described by referring to FIG. 2, that is, the problem that more electric power is required by returning an electric current to the power supply side when no electric current flows through the load. FIG. 5 shows the second conventional technology in which an electric current flows through the circuit shown in FIG. 2. In FIG. 5, a transistor 41 is used to provide an electric current flowing through the transistor 10 through a current mirror circuit.

Assuming that the ratio of the area of the emitter of the transistor 41 forming part of a current mirror circuit to that of the transistor 10 is m:n, the transistor 13 is turned on by the inverter 14 even if the transistor (switch) 11 is turned off when it is not necessary to provide an electric current to the load 12. At this time, the electric current Ia flowing through the entire circuit is a total of the electric currents flowing through the transistors 41 and 10. Assuming that I indicates the electric current flowing through the transistor 41, Ia=I+ (n/m)·I.

FIG. 6 shows the electric current flowing through the circuit when the present invention is applied to the circuit shown in FIG. 5. In this circuit, a transistor 50 replaces the transistor 13 between the connection point of the transistors 10 and 11, and the connection point of the original current source of the current mirror not shown in the attached drawings and the transistor 41. The inverter 14 is connected to the gate of the transistor 50.

In FIG. 6, the electric current provided for the transistor 10 which forms part of a current source is provided by the current mirror circuit when an electric current flows through the load 12. When it is unnecessary that an electric current flows through the load 12, the transistor 11 is in the OFF state while the transistor 50 is in the ON state. Thus, the transistors 10 and 41 are connected in parallel, and the electric current flowing through the entire circuit becomes the current I of the original current source of the current mirror circuit. As a result, the power consumption when no electric current flows through the load 12 becomes smaller than in the circuit shown in FIG. 5.

Figure 7:
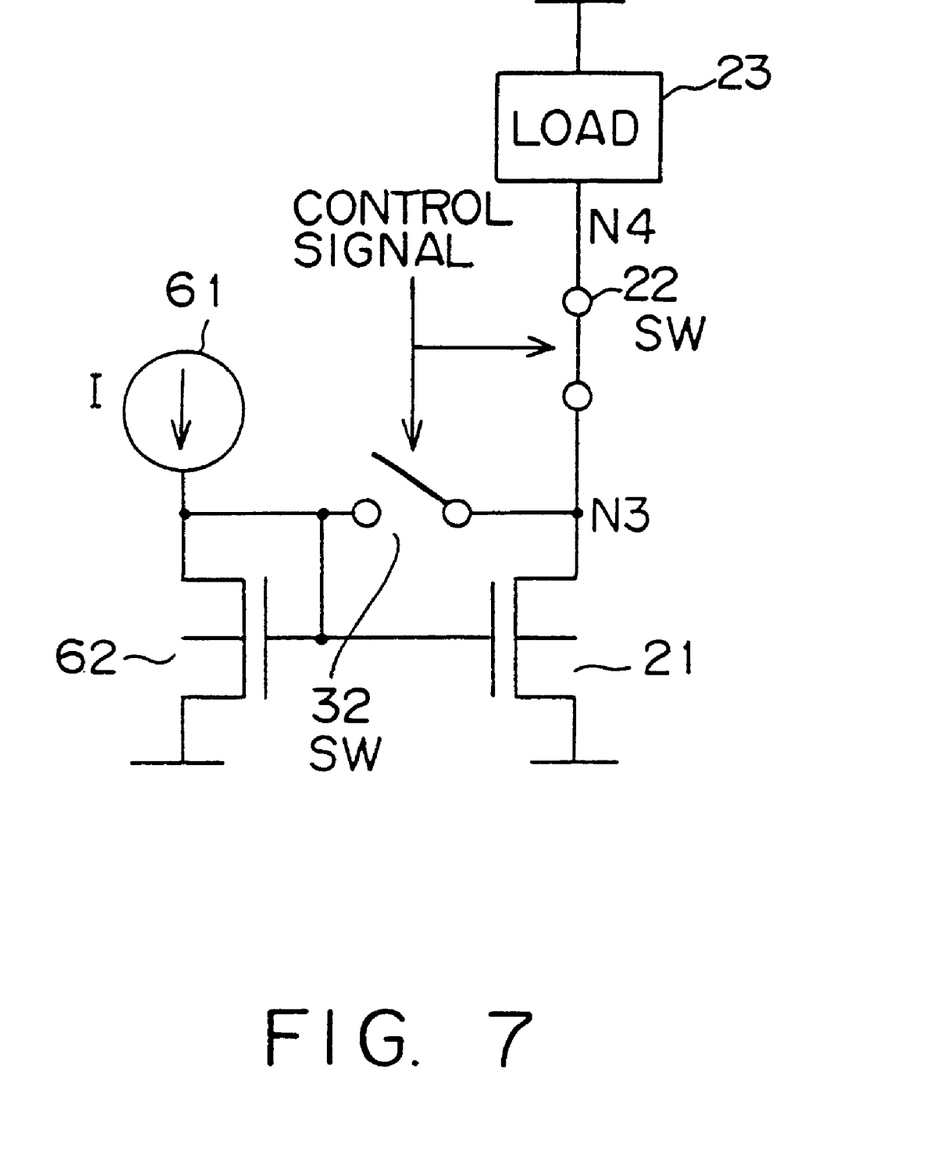
FIG. 7 shows the configuration of the current source switch circuit as the first embodiment of the present invention.

FIG. 7 shows the first embodiment of the present invention. In FIG. 7, the electric current provided for the transistor 21 forming part of a current source is provided by a current mirror circuit. An original current source 61 provides an electric current I. The gate of a transistor 62 simulated as a diode in the current mirror circuit and, for example, a drain is connected to one side of the switch 32. The opposite side of the switch 32 is connected to the connection point between the transistor 21 forming part of a current source and the switch 22. This connection point is shown as node N3.

In FIG. 7, the phases of the operations of the switches 22 and 32 are opposite to each other. When one of them is turned ON, the other is turned OFF. Therefore, when no electric current flows through the load 23, the voltage of the node N3 is equal to the voltage between the drain and the source of the transistor 62 simulated as a diode. As a result, the transistor 21 forming part of a current source is not turned off, and an electric current can be provided for the load 23 quickly and stably when the switch 22 is turned from OFF to ON and an electric current flows through the load 23 again. In addition, as described by referring to FIG. 6, the electric current provided by the power supply becomes smaller than in the conventional technology when an electric current does not flow through the load 23, thereby reducing the power consumption.

Figure 8:
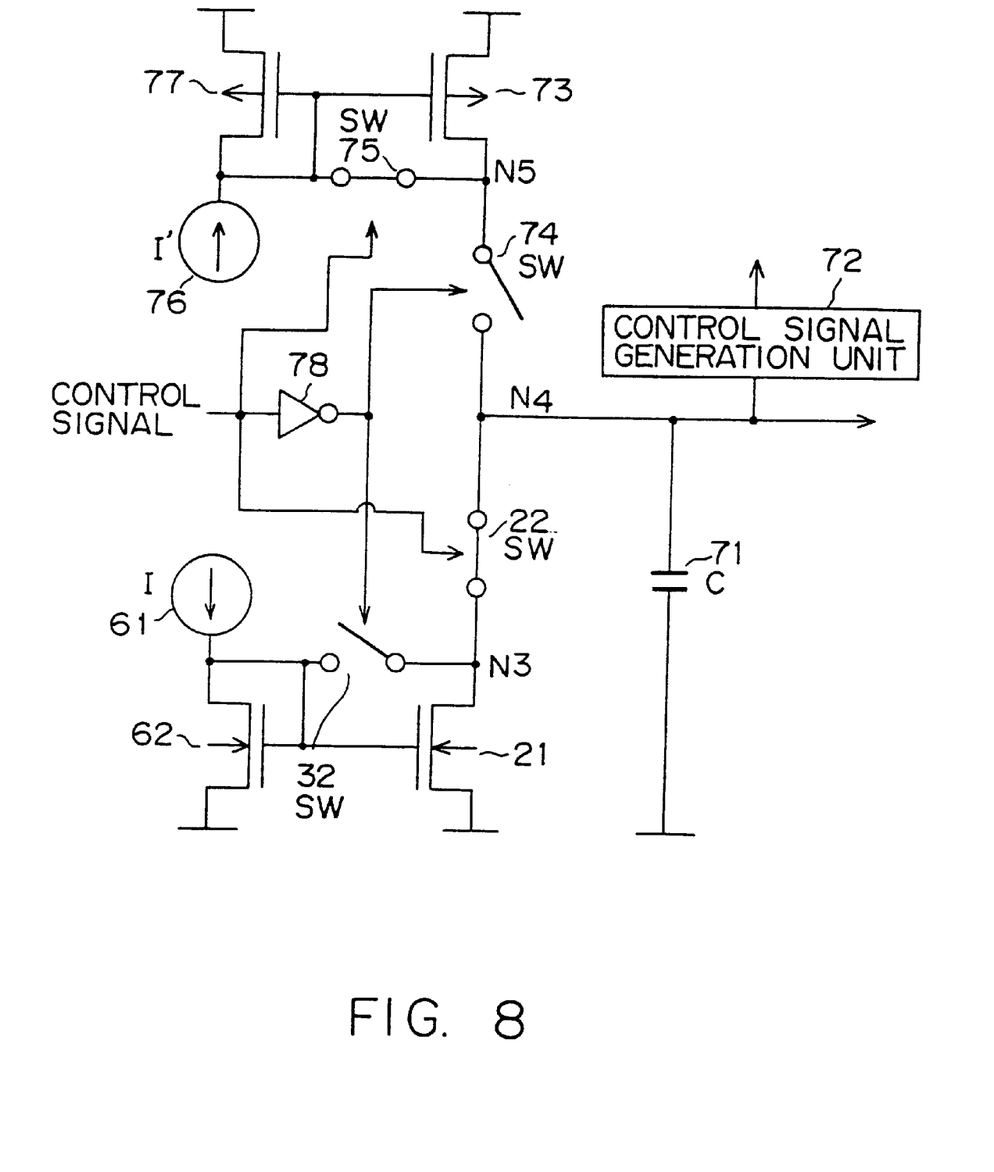
FIG. 8 shows the configuration of the triangular wave generation circuit (1) using the current source switch circuit according to the second embodiment of the present invention.

FIG. 8 shows the configuration of the triangular wave generation circuit using the current source switch circuit according to the second embodiment of the present invention. A static capacitor 71 shown in FIG. 8 corresponds to the load 23 shown in FIG. 7.

In current sources of the two current mirror circuits, it is assumed that I indicates the electric current provided by the original current source 61, and I' indicates the electric current provided by the other original current source 76. These values are not necessarily different from each other, but can be equal to each other for generation of a triangular wave.

In FIG. 8, the switches 22 and 75 are simultaneously turned on. While these two switches 22 and 75 are in the ON state, the switches 32 and 74 are in the OFF state. These switches are turned on and off according to the control signal generated by a control signal generation unit 72. Since a control signal is inverted and provided by an inverter 78 for the switches 32 and 74, the operational phases of the switches 22 and 75 have an inverse relationship to those of the switches 32 and 74.

Figure 9:
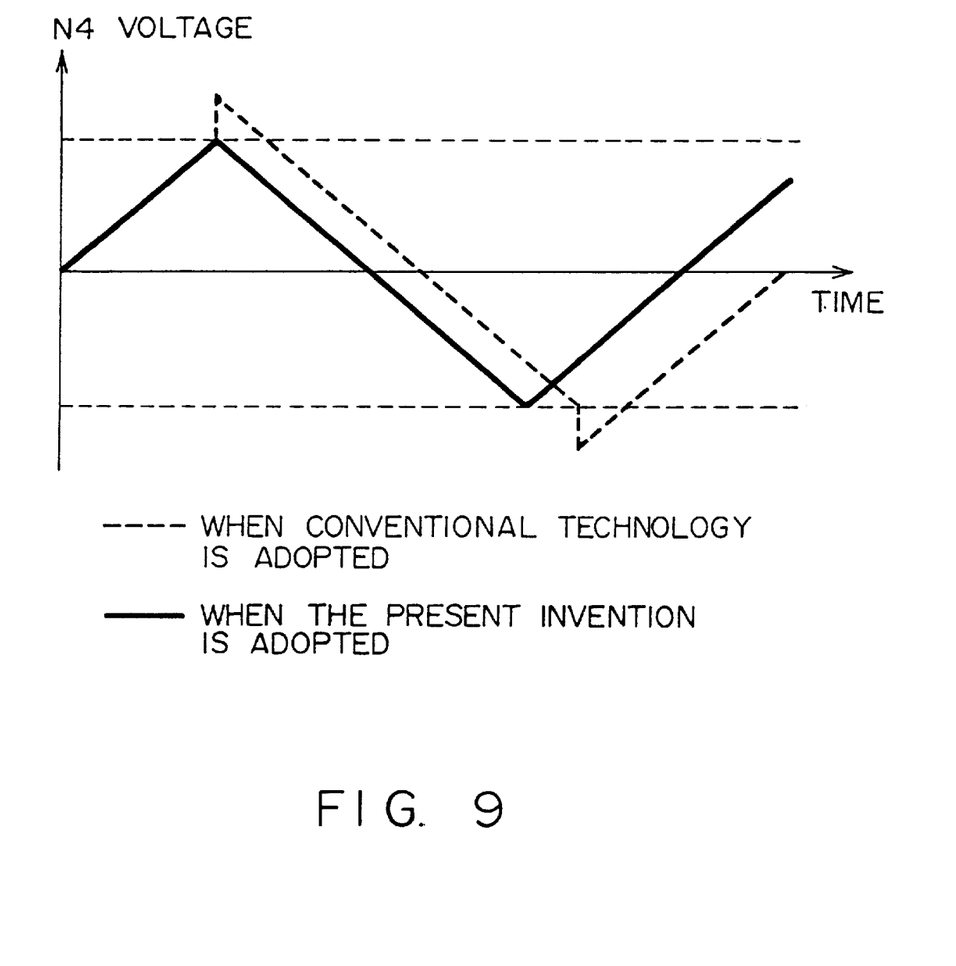
FIG. 9 shows a variation of the terminal voltage of the static capacitor shown in FIG. 8.

The operation of the triangular wave generation circuit shown in FIG. 8 is described by referring to FIG. 9. FIG. 9 shows a variation of the terminal voltage of the node N4 shown in FIG. 8, that is, the static capacitor 71.

In FIG. 8, assume that the switches 22 and 75 are in the OFF state while the switches 32 and 74 are in the ON state. In these states, a transistor 73 on the power supply side functions as a current source, and an electric current is provided through the switch 74. As a result, a static capacitor 71 is charged, and its terminal voltage linearly rises. When, for example, a predetermined maximum value is reached, the control signal generation unit 72 generates a control signal such that the switches 32 and 74 are turned off while the switches 22 and 75 are turned on, thereby the settings ON and OFF of a switch are changed. As a result, the transistor 21 becomes effective as a current source of the static capacitor 71 which is a load. When the transistor 21 makes an electric current flow from the node N4 to, for example, the ground side, the static capacitor 71 is discharged, and its terminal voltage linearly drops.

When the terminal voltage of the static capacitor 71 reaches a predetermined minimum value, the control signal generation unit 72 generates a control signal such that the switches 22 and 75 are turned off while the switches 32 and 74 are turned on. Thus, an electric current is provided for the static capacitor 71 from the transistor 73 through the switch 74, and the static capacitor 71 starts charging. By repeating the above described processes, a triangular wave is generated.

In FIG. 8, the switch 32 is turned on while the switch 22 is turned off. Similarly, on the power supply side, the switch 75 is turned on while the switch 74 is turned off. As a result, the transistors 21 and 73, which form part of current sources used in charging and discharging the static capacitor 71, are not turned off, but continue their operations in the saturation area when no electric current flows through the load. The power consumption can be smaller than in the conventional technology for the reason described above by referring to FIG. 6.

The broken lines shown in FIG. 9 show an example of the generated waveform when the conventional technology shown in FIG. 1 is used in a triangular wave generation circuit. In this example, the generated waveform of the conventional technology is described using the unit numbers used for the circuit shown in FIG. 8.

As shown in FIG. 9, the voltage suddenly rises when the switch 22 is turned from off to on, and the switch 74 is turned from on to off, that is, when the terminal voltage of the static capacitor 71 reaches the maximum value. The voltage does not necessarily rise at a change of switches. The change depends on a small time difference, etc. between the ON/OFF operations of the switches 22 and 74. For example, even if the switch 74 is turned off before the switch 22 is turned on, the transistor 21 is turned off according to the conventional technology, and the node N5 functions with a power supply voltage. Therefore, the voltage of the node N4 temporarily follows the power supply side, thereby generating a rise of the voltage.

The rise is caused by the charge and discharge of the parasitic capacitance between the drain and the gate of a transistor although the detailed explanation is omitted here. Anyway, the terminal voltage of the static capacitor 71 falls from the voltage that has risen. Therefore, the cycle of the triangular wave is longer.

On the other hand, when the current source switch circuit according to the present invention is used, operations are performed in the saturation area even when the transistors 73 and 21 forming part of current sources allow no electric currents to flow through a load. Accordingly, there is a small charge and discharge to the junction capacitance, causing no voltage rise when the switches are changed. As a result, a quick and stable switch can be realized. In addition, the cycle is not as long as in the conventional technology. As a result, the value of the electric current of the current source upon which the cycle depends, and the value of the static capacitance can be small. Thus, the layout area in an LSI can be smaller. Therefore, the power consumption can be reduced.

Figure 10:
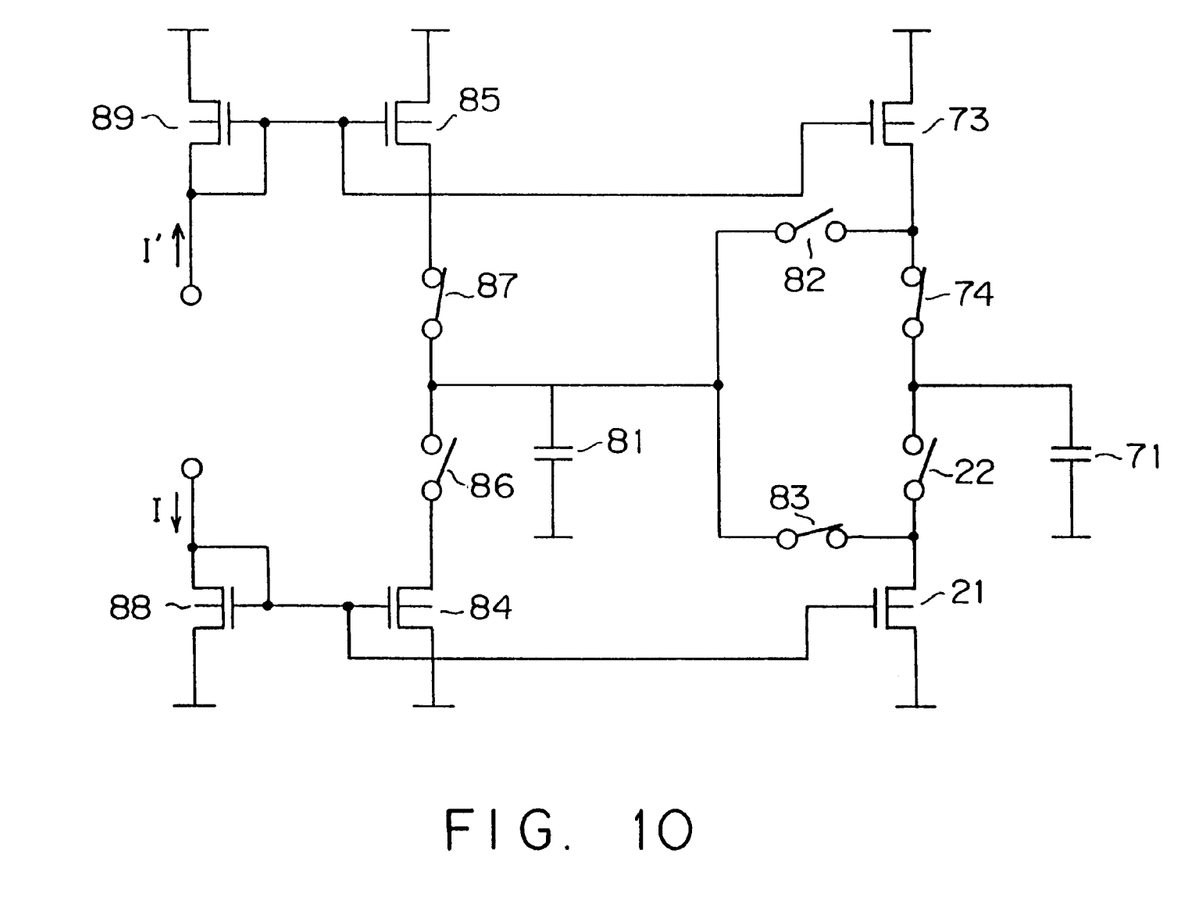
FIG. 10 shows the configuration of the triangular wave generation circuit (2) using the current source switch circuit according to the third embodiment of the present invention.

FIG. 10 shows the configuration of the triangular wave generation circuit (2) using the current source switch circuit according to the third embodiment of the present invention.

The circuit shown in FIG. 10 sets the value of the voltage to be provided for the node N3 when no electric current flows through the load 23 in FIG. 4 such that the voltage can maintain the value depending on the voltage of the node N4 when an electric current flows through the load 23. In FIG. 10, the unit also shown in FIG. 8 is assigned the same reference numbers (the transistor 21, the static capacitor 71, the switches 22 and 74).

In FIG. 10, the switch 22, 82, and 86 are simultaneously turned ON. While these switches are turned ON, the switches 74, 83, and 87 are simultaneously turned OFF. A static capacitor 81 is used to obtain substantially the same voltage as the static capacitor 71. Therefore, a transistor 85 should be the same as the transistor 73, a transistor 84 should be the same as the transistor 21, and the value of the static capacitor 81 should be equal to the value of the static capacitor 71.

While the switches 74, 83, and 87 are turned ON, the two static capacitors 71 and 81 are charged as in the circuit shown in FIG. 8, and the terminal voltage linearly rises. When these three switches are turned off and the switches 22, 82, and 86 are turned on, the two static capacitors 71 and 81 are discharged, and the terminal voltage linearly lowers. These operations are similar to those of the circuit shown in FIG. 8.

In the circuit shown in FIG. 8, the voltage applied to the node N3 while the switch 22 is set OFF corresponds to the voltages on both ends of the transistor 62 simulated as a diode in the current mirror circuit. Considering the change (including the charge/discharge to the parasitic capacitance) in voltage between the drain and the source of the transistor forming the switch 22, the voltage at node N3 is actually not equal to the voltage of the terminal voltage of the load 23 (static capacitor 71), that is, the voltage of the node N4.

On the other hand, in the circuit shown in FIG. 10, for example, the drain voltage of the transistor 21 can be maintained as equal to the terminal voltage of the static capacitor 81 by turning on the switch 83, that is, the terminal voltage of the static capacitor 71 as a load, thereby avoiding the discontinuous changes of the drain voltage when the switch 22 is then turned on. In addition, as shown by referring to FIG. 8, the power consumption can be reduced by using smaller values of the electric current of the current source, on which the cycle depends, and the static capacitance.

According to the above described embodiments of the present invention, the CMOS FET is used as a transistor. However, the current source switch circuit according to the present invention is not limited to a CMOS transistor, but can be realized using an NMOS transistor or PMOS transistor. For example, only the current source can be designed using a bipolar transistor. When a voltage is applied to the transistor forming part of a current source, an original current source of the current mirror circuit can be used. In some cases, a constant voltage element such as a Zener diode, etc. can be used. The present invention can be variable within the scope of its purposes.

As described above in detail, according to the present invention, the transistor forming part of a current source is maintained to be operating in the saturation area even when it is not necessary to allow an electric current to flow through a load. Therefore, a quick switch can be realized when an electric current flows through the load again, thereby obtaining a stable electric current. Furthermore, the voltage to be applied to the drain of the transistor can be set substantially equal to the terminal voltage of the load when an electric current flows through the load again, thereby realizing a stable and quick switch. When the current source switch circuit according to the present invention is applied to various circuits, the layout area of an LSI can be made smaller, or the power consumption can be reduced. As a result, the present invention greatly contributes to the improvement of the performance of the LSI.

What is claimed is:

1. A current source switch circuit having a transistor forming part of a current source and a switch for controlling the supply of an electric current from said transistor to a load, comprising:

a current mirror circuit having said current source at a mirror side said current mirror circuit comprising:

a voltage generation unit generating a voltage having a value in an operation state as said current source of said transistor; and said switch circuit further comprises a voltage application unit applying said voltage generated by said voltage generation unit to said transistor when no electric current is provided from said switch to the load.

2. The circuit according to claim 1, wherein:

said voltage generation unit comprises a transistor simulated as a diode in said current mirror circuit, and an original current source of said current mirror circuit; and said voltage application unit applies said voltage as a voltage at a connection point between said transistor simulated as a diode in said current mirror circuit and said original current source of said current mirror circuit to said transistor forming part of said current source.

3. The circuit according to claim 1, wherein said voltage generation unit generates said voltage as a terminal voltage to be applied to said transistor forming part of said current source when an electric current is next provided for the load when no electric current is provided from the switch to the load.

4. The circuit according to claim 3, wherein when said terminal voltage to be applied to the load changes with time, said voltage generation unit generates said voltage as a variable voltage in synchronization with said terminal voltage.

* * * * *